United States Patent
Knotts

(10) Patent No.: US 7,310,401 B2
(45) Date of Patent: Dec. 18, 2007

(54) PROGRAMMABLE FREQUENCY DETECTOR FOR USE WITH A PHASE-LOCKED LOOP

(75) Inventor: Thomas A. Knotts, Mountain View, CA (US)

(73) Assignee: Avago Technologies General IP PTE Ltd, Singapore (SG)

( * ) Notice: Subject to any disclaimer, the term of this patent is extended or adjusted under 35 U.S.C. 154(b) by 853 days.

(21) Appl. No.: 10/714,037

(22) Filed: Nov. 14, 2003

(65) Prior Publication Data

US 2005/0105660 A1    May 19, 2005

(51) Int. Cl.
*H03D 3/24* (2006.01)
(52) U.S. Cl. .............. 375/376; 327/147; 327/156; 455/260
(58) Field of Classification Search ........... 375/376; 327/147, 156; 455/260
See application file for complete search history.

(56) References Cited

U.S. PATENT DOCUMENTS

| | | | |
|---|---|---|---|
| 5,982,208 A | 11/1999 | Kokubo et al. | |
| 6,055,286 A | 4/2000 | We et al. | |
| 6,329,853 B1 | 12/2001 | Iinuma | |
| 6,392,495 B1 | 5/2002 | Larsson | |
| 2002/0018038 A1* | 2/2002 | Onishi et al. | 345/98 |
| 2003/0118380 A1* | 6/2003 | Koide | 399/299 |
| 2005/0057289 A1* | 3/2005 | Pham | 327/156 |

OTHER PUBLICATIONS

B. Wu, R. Walker, "PLL Design in Hp's Gigabit Ethernet Transceiver," 1997 HP Design Technology Conference Proceedings, pp. 367-375.

* cited by examiner

*Primary Examiner*—David C. Payne
*Assistant Examiner*—Nader Bolourchi

(57) ABSTRACT

A frequency detector for use with a PLL utilizes a counter and a preset value to produce frequency information related to a VCO signal. The frequency information is used to control the frequency of the VCO signal and to determine whether the VCO signal should be controlled by the frequency detector or a phase detector. Using the counter and preset value involves establishing a preset value that is used to obtain the desired frequency information. The preset value is set such that the counter is at one-half full-scale at the end of a known time period when the VCO signal is oscillating at a target frequency. When the preset value is set to such a value, the most significant bit of the counter after the known time period indicates whether the frequency of the VCO signal is above or below the target frequency.

15 Claims, 8 Drawing Sheets

| UP | DOWN | SIGN | ACTIVE | $I_c$ |
|----|------|------|--------|-------|
| X | X | 1 | 1 | $-I_1$ |
| X | X | 0 | 1 | $+I_1$ |
| 1 | 0 | X | 0 | $+I_1$ |
| 0 | 1 | X | 0 | $-I_1$ |

FIG. 1B

```
┌─────────────────────────────────────────┐
│      Establish a preset value           │─── 902
└─────────────────────────────────────────┘
                    │
                    ▼
┌─────────────────────────────────────────┐
│  Preset a counter value to the preset value │─── 904
└─────────────────────────────────────────┘
                    │
                    ▼
┌─────────────────────────────────────────┐
│ Change the counter value from the preset │
│ value in response to a voltage controlled │─── 906
│ oscillator (VCO) signal over a known time period │
└─────────────────────────────────────────┘
                    │
                    ▼
┌─────────────────────────────────────────┐
│  Obtain frequency information related    │
│  to the VCO signal from the counter      │─── 908
│  value at the end of the known time period │
└─────────────────────────────────────────┘
```

FIG. 9

PROGRAMMABLE FREQUENCY DETECTOR FOR USE WITH A PHASE-LOCKED LOOP

FIELD OF THE INVENTION

The invention relates to frequency detectors, and more particularly, to frequency detectors used with phase-locked loops.

BACKGROUND OF THE INVENTION

Phase-locked loops (PLLs) are used in data communications and telecommunications applications to lock onto the frequency of a signal. In particular, PLLs are often used in serializer/deserializer (SerDes) applications. A typical PLL includes a phase detector, a loop filter, and a voltage controlled oscillator (VCO) that produces a VCO signal. The phase detector compares an input signal with a portion of the VCO signal and produces an output that indicates the relative phase of the two signals. The output is provided to the loop filter and in response, the loop filter produces a voltage that causes the phase of the VCO signal to move closer to the input signal. A portion of the VCO signal is then looped back to the phase detector in a continuous process. When the loop is locked, the frequency and phase of the VCO signal track the frequency and phase of the input signal.

An important characteristic of a PLL is its ability to lock the VCO signal to the input signal even when the initial frequency of the VCO signal is far away from the frequency of the input signal. For example, the frequency of the input and VCO signals may be far apart when a PLL is first powered up, when there is a change to the applied input signal frequency, or when the input signal is reapplied to the PLL after a long absence.

A central component in ensuring signal lock is the phase detector. There are generally two classes of phase detectors, analog and digital. With a digital phase detector, if the frequency difference between the input and VCO signals is too large (typically greater than 1%), it is difficult for the PLL to achieve lock. Separate frequency detectors have been added to PLLs with digital phase detectors to ensure that the PLLs are able to achieve lock when the frequencies of the input and VCO signals are far apart (i.e., outside the capture range of the digital phase detector). A frequency detector typically uses an external reference clock to measure the frequency of the VCO signal. The measured frequency of the VCO signal is used to determine. whether or not the frequency detector should assert control over the VCO signal. If the frequency detector is to assert control over the VCO signal, then the frequency detector is used to pull the frequency of the VCO signal close to a pre-established target frequency. Once the frequency of the VCO signal is within the capture range of the phase detector, control of the VCO is switched over to the phase detector.

Many different techniques for frequency detection in PLLs have been developed. Although these techniques work well, there is still a need for a flexible frequency detection technique that supports a wide range of target and reference clock frequencies and that asserts control over the VCO signal at the proper time.

SUMMARY OF THE INVENTION

A frequency detector for use with a PLL utilizes a counter and a preset value to efficiently produce frequency information related to a VCO signal. The frequency information is used to control the frequency of the VCO signal and to determine whether the frequency of the VCO signal should be controlled by the frequency detector or the phase detector of the PLL. Using the counter and preset value to produce frequency information involves establishing a preset value that is used to obtain the desired frequency information. For example, the preset value is set such that the counter is at one-half full-scale at the end of a known time period, as measured using an available reference clock, when the VCO signal is oscillating at a target frequency. When the preset value is set to such a value, the most significant bit (MSB) of the counter after the known time period indicates whether the frequency of the VCO signal is above or below the target frequency. The MSB can then be used to control the VCO to increase or decrease the frequency of the VCO signal. Using the counter and programmable preset value, the frequency detector can be easily set to different target frequencies irrespective of the frequency of the available reference clock.

The frequency information is also used to determine whether or not the frequency detector controls the frequency of the VCO signal in the place of the digital phase detector. The frequency information indicates whether the frequency difference between the VCO signal and the target frequency exceeds a pre-established limit. If the pre-established limit is exceeded, then the frequency detector controls the VCO signal and if the pre-established limit is not exceeded, then control of the VCO signal is left to the digital phase detector.

The frequency information can also be used to reduce the frequency acquisition time of a frequency detector. Reducing the frequency acquisition time involves applying different charging currents to the capacitor of the PLL depending on the frequency difference between the VCO signal and the target frequency. The different charging currents are higher than the charging current that is supplied to the capacitor when the digital phase detector is controlling the VCO signal, therefore causing greater frequency shifts and faster frequency acquisition during each correction cycle.

BRIEF DESCRIPTION OF THE DRAWINGS

FIG. 1B depicts operational logic and resulting currents ($I_C$) through the capacitor in the loop filter of FIG. 1A.

FIG. 9 depicts a process flow diagram of a frequency detection method in accordance with the invention.

Throughout the description similar reference numbers are used to identify similar elements.

DETAILED DESCRIPTION

The task of a PLL is to lock the phase and frequency of a VCO signal to a particular signal, referred to herein as an input signal. PLLs with digital phase detectors often include separate frequency detectors to ensure that the PLLs are able to achieve lock when the frequency difference between the input and VCO signals is outside the capture range of the digital phase detector. In accordance with the invention, a frequency detector for use with a PLL utilizes a counter and a preset value to efficiently produce frequency information related to the VCO signal. The frequency information can be used to manipulate the VCO signal and to determine whether the VCO signal should be controlled by the frequency detector or a digital phase detector of a PLL.

Figure 1A:
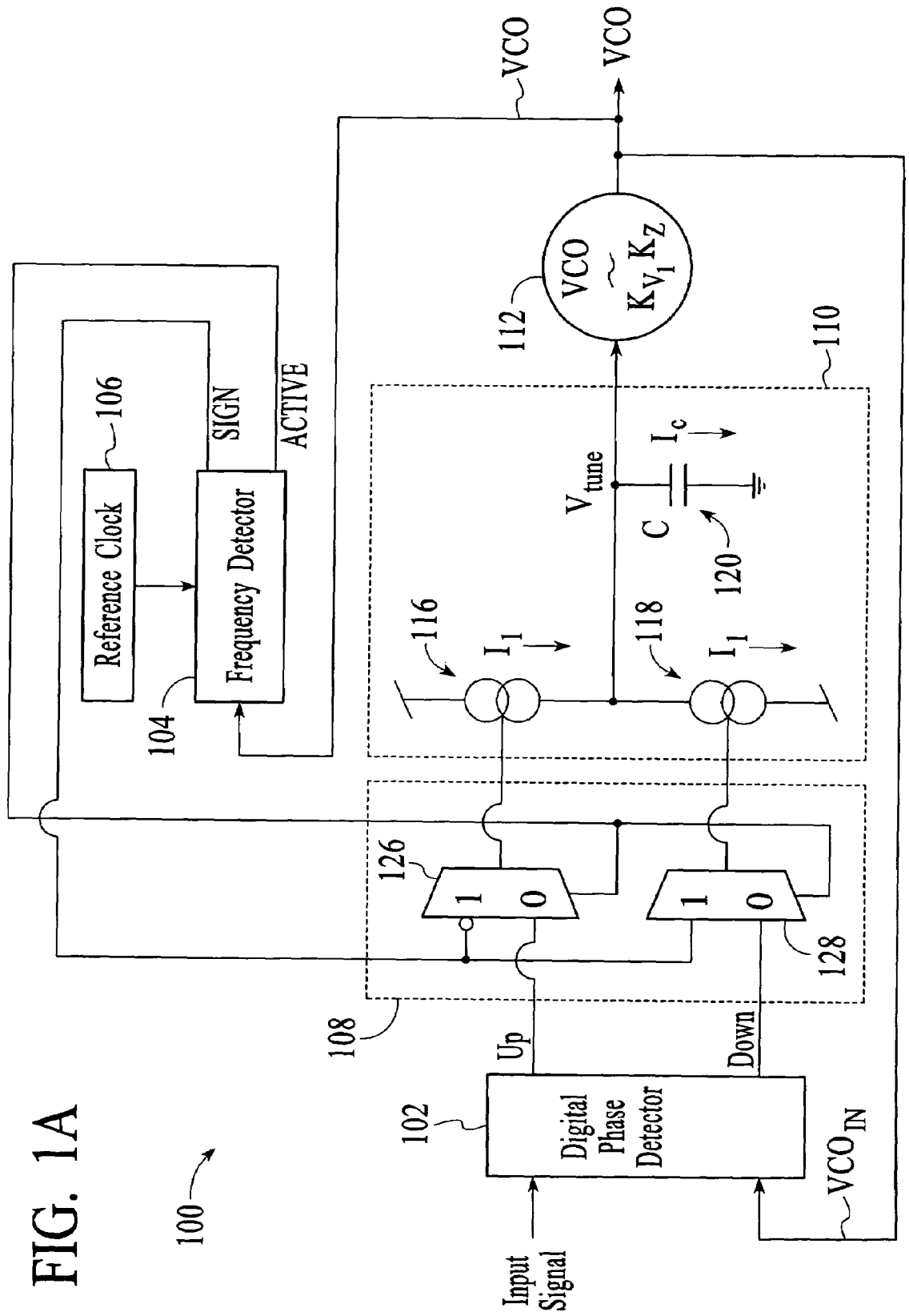
FIG. 1A depicts an embodiment of a PLL that includes a digital phase detector, a frequency detector, a reference clock, selection logic, a loop filter, and a voltage controlled oscillator (VCO).

FIG. 1A depicts an embodiment of a PLL 100 that includes a digital phase detector 102, a frequency detector 104, a reference clock 106, selection logic 108, a loop filter 110, and a voltage controlled oscillator (VCO) 112. The VCO receives a VCO control signal from the loop filter and produces a VCO signal as an output. Portions of the VCO signal are fed into the digital phase detector and the frequency detector.

The loop filter 110 generates the VCO control signal in response to signals from either the digital phase detector 102 or the frequency detector 104. In the embodiment of FIG. 1A, the loop filter includes two current sources 116 and 118 and a capacitor 120. When a current of $I_1$ is generated at one of the current sources, a corresponding charging current, $I_C$, is applied to the capacitor and a corresponding voltage, $V_{tune}$, is generated. The voltage, $V_{tune}$, is applied to the VCO 112 to control the frequency of the VCO signal. When a charging current of $+I_1$ is applied to the capacitor, the voltage, $V_{tune}$, applied to the VCO is increased and the frequency of the VCO is increased. When a charging current of $-I_1$ is applied to the capacitor, the voltage, $V_{tune}$, applied to the VCO is decreased and the frequency of the VCO is decreased.

The digital phase detector 102 is connected to receive an input signal and a portion of the VCO signal ($VCO_{IN}$). The digital phase detector compares the input signal with the VCO signal and produces an output that indicates the phase difference between the two signals. In the embodiment of FIG. 1A, the digital phase detector produces an UP signal when the phase of the input signal leads the phase of the VCO signal and a DOWN signal when the phase of the input signal lags the phase of the VCO signal. An UP signal causes the frequency of the VCO to be driven upward while a DOWN signal causes the frequency of the VCO signal to be driven downward, thereby driving the phase of the VCO signal up or down, respectively.

The frequency detector 104 is connected to receive a portion of the VCO signal from the VCO and a reference clock signal from the reference clock 106. The portion of the VCO signal that is received at the frequency detector may be divided by N using a signal divider (not shown). The frequency detector measures the frequency of the VCO signal, determines whether or not the VCO signal should be controlled by the frequency detector, and generates a control signal that is applied to the loop filter 110. The frequency detector is the focus of the invention and is described in more detail below with reference to FIGS. 2-9.

The selection logic 108 determines which signal is used to control the VCO. In particular, the selection logic receives a signal from the frequency detector 104, referred to herein as the "ACTIVE" signal, which controls whether the VCO is controlled by the digital phase detector 102 or the frequency detector. In the embodiment of FIG. 1A, the selection logic includes two selection multiplexers 126 and 128 that are controlled by the ACTIVE signal. The selection multiplexer 126 is referred to herein as the "UP" multiplexer and the selection multiplexer 128 is referred to herein as the "DOWN" multiplexer. Each of the selection multiplexers is connected to receive a respective input from the digital phase detector and a respective input from the frequency detector.

In operation, when the ACTIVE signal is high (e.g., a "1"), the signal from the frequency detector 104 controls the VCO. When the ACTIVE signal is low (e.g., a "0"), the signals from the digital phase detector 102 control the VCO. The selection logic 108 provides high or low signals (e.g., 1 or 0) to the current sources 116 and 118 of the loop filter 110 via the respective multiplexers 126 and 128. When a high signal is provided to current source 116 via the UP multiplexer 126 and a low signal is provided to current source 118 via the DOWN multiplexer 128, the current $+I_1$ is applied to the capacitor 120. The current $+I_1$ causes the frequency of the VCO signal to increase. When a low signal is provided to the current source 116 from the UP multiplexer 126 and a high signal is provided to current source 118 from the DOWN multiplexer 128, the current $-I_1$ is applied to the capacitor. The current $-I_1$ causes the frequency of the VCO signal to decrease. The operational logic and resulting currents, $I_C$, through the capacitor are depicted in FIG. 1B.

Figure 2:
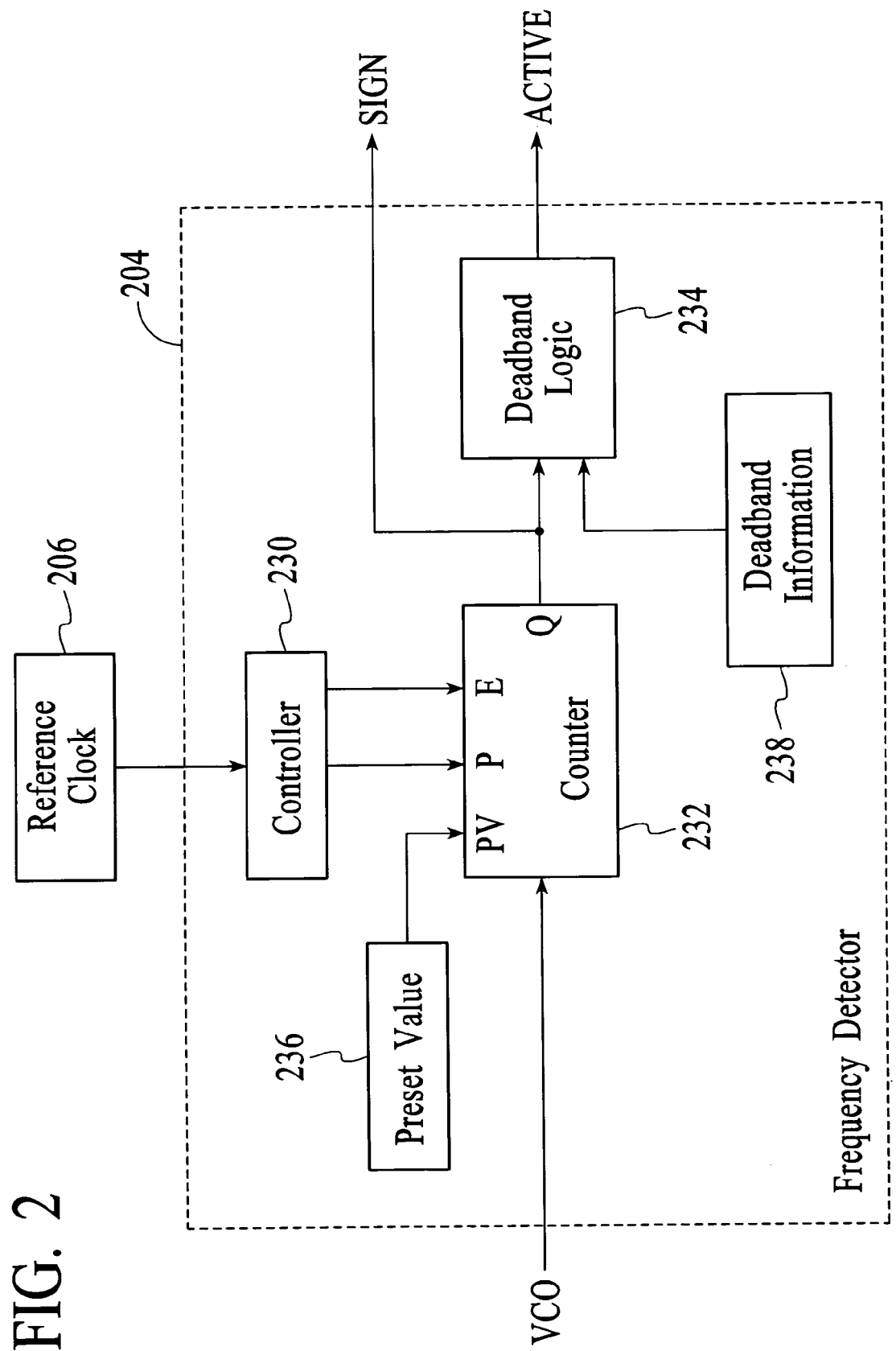
FIG. 2 depicts an embodiment of a frequency detector that utilizes a counter and a programmable preset value in accordance with the invention.

As stated above, a focus of the invention involves the frequency detector 104 and frequency detection techniques. In accordance with the invention, a counter and a programmable preset value are utilized in a frequency detector to efficiently measure the frequency of the VCO signal and to provide a VCO control signal to the loop filter. Using the counter and programmable preset value, the frequency detector can be easily set to different target frequencies irrespective of the frequency of the available reference clock. FIG. 2 depicts an embodiment of a frequency detector 204 that utilizes a counter and a programmable preset value to achieve the desired performance. The frequency detector includes a controller 230, a counter 232, deadband logic 234, memory 236 for storing the programmable preset value, and memory 238 for storing the programmable deadband information. The frequency detector receives a VCO signal from the VCO and a reference clock signal from the reference clock. The frequency detector produces frequency information in the form of a "SIGN" signal and selection information in the form of the ACTIVE signal in response to the VCO and reference clock signals.

The controller 230 of the frequency detector 204 receives a reference clock signal from the reference clock 206. The reference clock signal is used to measure known time periods over which the counter 232 is incremented. The controller provides a preset signal (P) to the counter that causes the counter to be set to a preset value (PV). The controller also provides an enable signal (E) to the counter that causes the counter to start and stop incrementing. Alternatively, the preset and enable signals may be provided to the counter by a single signal such as a tristate signal. The controller may be embodied in hardware, software, firmware, or any combination thereof. In the embodiment of FIG. 2, the controller is embodied as a hardware circuit. Additionally, although the reference clock is depicted as external to the frequency detector, the reference clock may be incorporated into the frequency detector.

The counter 232 receives a VCO signal from the VCO 112 (FIG. 1A) and is incremented in response to the VCO signal. In particular, the counter is incremented in response to voltage transitions of the VCO signal. The counter outputs frequency information in the form of a counter value (Q), which is used to produce the SIGN and ACTIVE signals as described below. The counter is preset to the preset value in response to the preset signal and enabled or disabled in response to the enable signal. Enabling the counter causes the counter to start incrementing and disabling the counter causes the counter to stop incrementing. Alternatively, the counter could be enabled by an enable signal and disabled by a separate disable signal. The term "enable signal" is understood herein to include any signal or signals that are used to start and stop the counter. In the embodiment of FIG. 2, the counter is a binary digital counter, although other counter types are possible. Additionally, although the counter is changed by incrementing, the counter could be changed by decrementing instead of incrementing.

In operation, the counter 232 is incremented in response to the VCO signal over a known time period (as measured by the reference clock signal) and frequency information is derived from the number of voltage transitions that occur over the known time period. The frequency information can then be used to control the VCO. In the embodiment of FIG. 2, the frequency detector determines if the frequency of the VCO signal is above or below a target frequency. Typically, the target frequency is set to coincide with the expected frequency or data rate of the input signal. If the measured frequency of the VCO signal is less than the target frequency, then the frequency of the VCO signal is increased and if the frequency of the VCO signal is greater than the target frequency, then the frequency of the VCO signal is decreased.

In an embodiment of the frequency detector 204, determining whether the VCO signal is greater than or less than the target frequency involves establishing a preset value for the counter that will provide the desired frequency information. In an embodiment, the preset value is set such that the counter 232 is at one-half full-scale at the end of a known time period when the VCO signal is oscillating at the target frequency. When the preset value is set to such a value, the determination of whether the frequency of the VCO signal is above or below the target frequency can be made simply by looking at the most significant bit (MSB) of the counter after the known time period. This is possible because the MSB will change from "0" to "1" when the counter passes one-half full-scale, which is the point that represents the target frequency. In an embodiment, the preset value is stored in an on-chip memory, for example, a serial shift register. The preset value can be programmed to any value that is supported by the width of the available memory field.

With the frequency detector 204 depicted in FIG. 2, generating frequency information involves first setting the counter 232 to the preset value in response to the preset signal (P). Once the counter is set to the preset value, the counter is started in response to the enable signal (E). The counter is incremented in response to the VCO signal for a known time period, where the known time period is measured using the reference clock signal. At the end of the known time period, the counter is stopped in response to the enable signal. The final counter value is used to obtain the desired frequency information. With a binary digital counter, the MSB of the counter will change from "0" to "1" at one-half of full-scale and therefore, if the MSB of the counter is "0" at the end of the known time period, then the frequency of the VCO signal is below the target frequency. Conversely, if the MSB of the counter is "1" at the end of the known time period, then the frequency of the VCO signal is above the target frequency. Hence, in the embodiment of FIG. 2, the SIGN signal is simply the state of the MSB (e.g., either "0" or "1") of the counter value at the end of a sample of a known time period. The SIGN signal is fed into the selection logic 108 (as shown in FIG. 1A) and controls the VCO. Referring back to FIGS. 1A and 1B, if the SIGN signal is "0", a "1" is applied to current source 116 and a "0" is applied to current source 118, thereby causing a charging current, $I_C$, of $+I_1$. If the SIGN signal is "1", a "0" is applied to current source 116 and a "1" is applied to current source 118, thereby causing a charging current, $I_C$, of $-I_1$.

Using the above-described technique, the target frequency can be adjusted by programming the preset value, the known sample time, or both. The adjustment of the target frequency is made independent of the frequency of the reference clock and as a result, different target frequencies can be easily established from the same reference clock. The flexibility provided by this technique is useful in SerDes applications that involve interleaved multisampling because only one reference clock is needed to establish different target frequencies.

Referring back to FIG. 2, the deadband logic 234 determines whether or not the frequency detector 204 controls the VCO in place of the digital phase detector 102 (as shown in FIG. 1A). In an embodiment, the deadband logic determines if the frequency difference between the VCO signal and a target frequency exceeds a pre-established limit, where the pre-established limit is set by a deadband input. If the frequency difference between the VCO signal and the target frequency exceeds the pre-established limit, then the frequency detector asserts control over the VCO and the corresponding signal is generated (e.g., ACTIVE=1). If the frequency difference between the VCO signal and the target frequency does not exceed the pre-established limit, then the frequency detector leaves control of the VCO to the digital phase detector and the corresponding signal is generated (e.g., ACTIVE=0).

Figure 3:
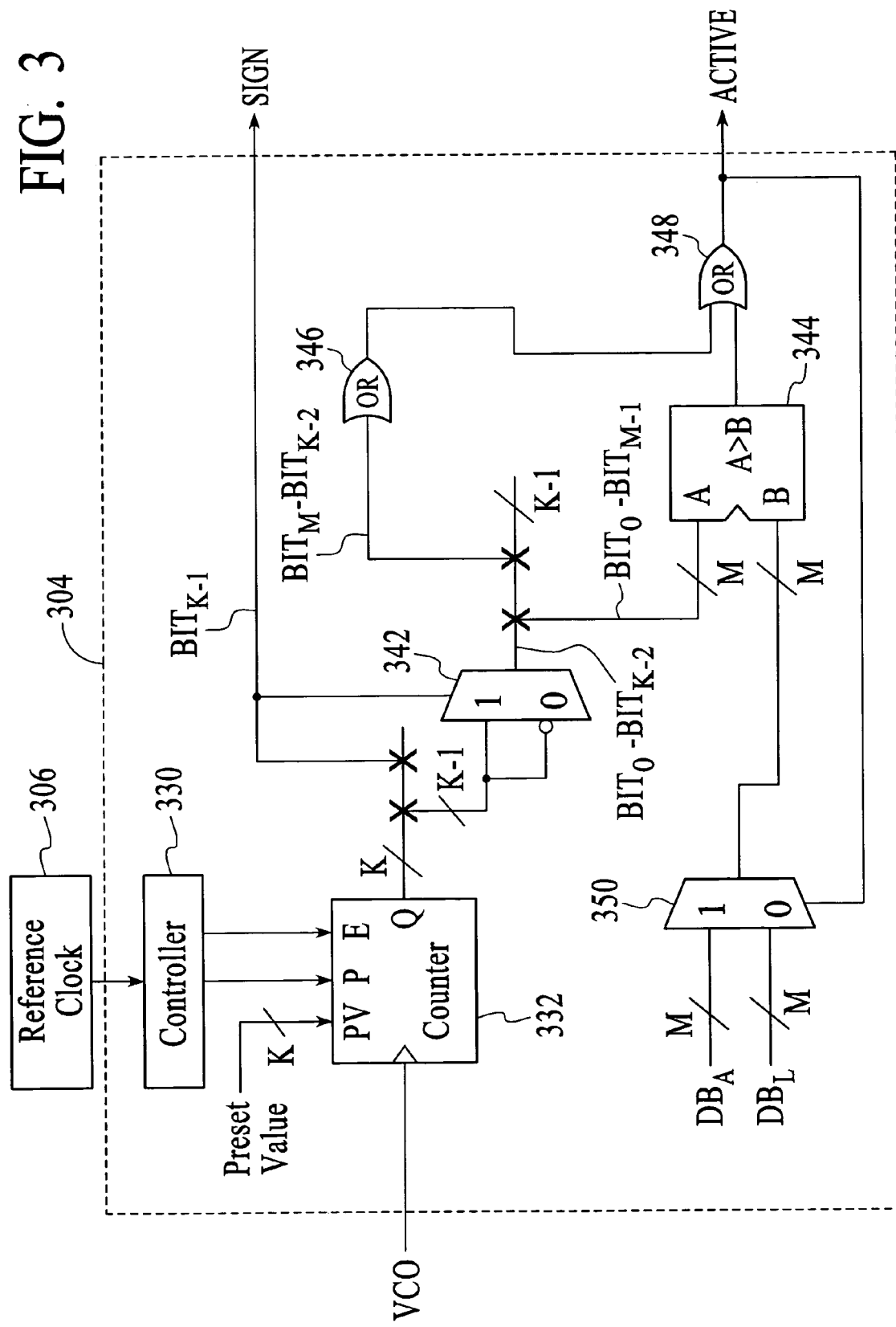
FIG. 3 depicts a more detailed embodiment of the frequency detector depicted in FIG. 2.
Figure 4:
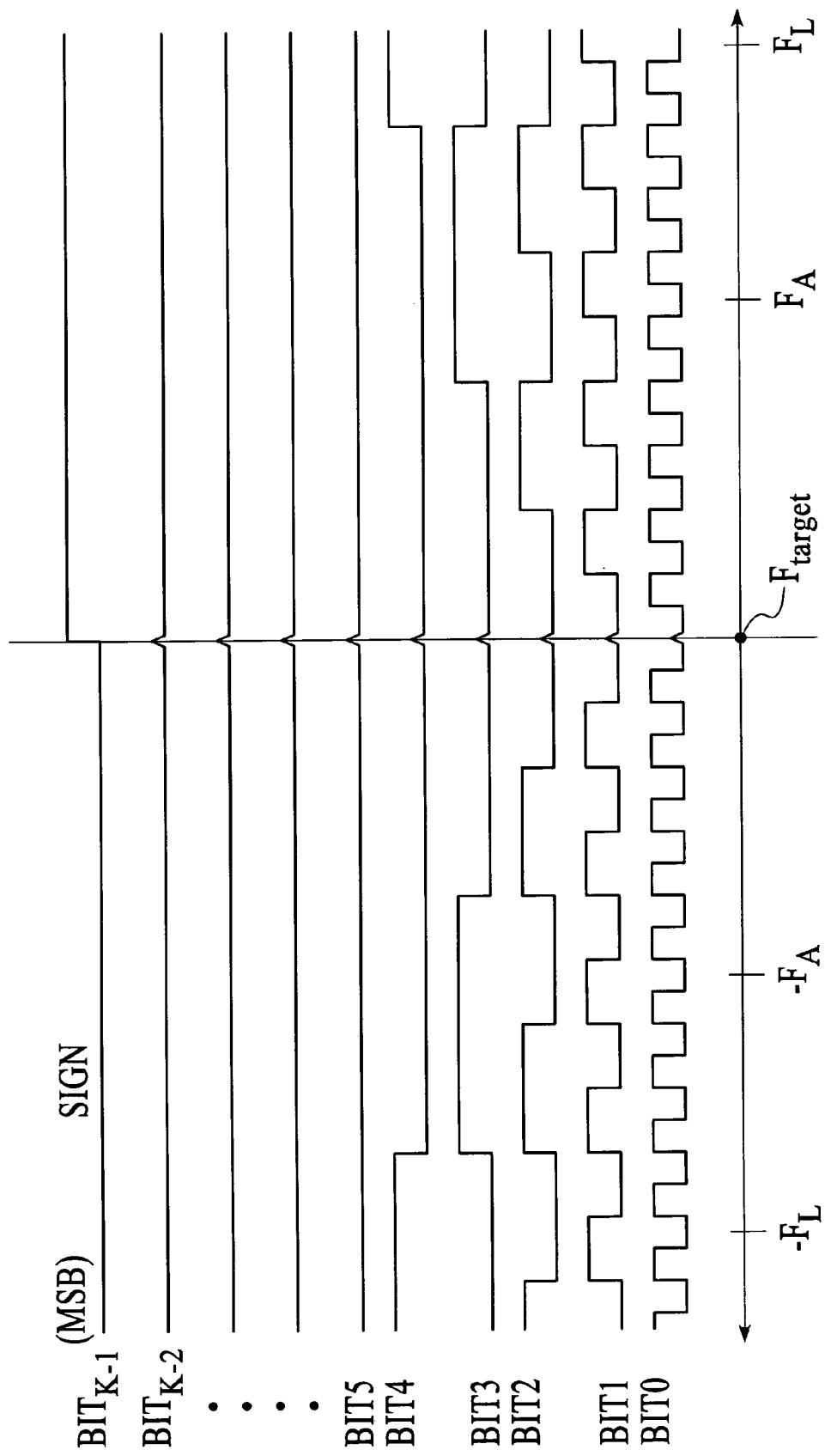
FIG. 4 depicts the output of the folded counter multiplexer in FIG. 3.

FIG. 3 depicts a more detailed embodiment of the frequency detector depicted in FIG. 2. The frequency detector 304 in FIG. 3 includes a counter 332, a controller 330, a folded counter multiplexer 342, a comparator 344, OR logic 346 and 348, and a deadband hysteresis multiplexer 350. As depicted in FIG. 3, a signal path of K-bits wide (including $BIT_0$ through $BIT_{K-1}$) exits from the counter (this assumes a K-bit counter is used). A signal path of $BIT_{K-1}$ is split from the K-bit signal path and used for the SIGN bit. The SIGN bit is then provided to the selection logic 108 (FIG. 1A) as described above. The additional logic is dedicated to determining whether the frequency detector should control the VCO in place of the digital phase detector. A signal path of $BIT_0$ through $BIT_{K-2}$ (K−1 bits wide) is obtained from the K-bit signal path and fed into the folded counter multiplexer 342. The signal path is fed into the folded counter multiplexer as is and inverted. The output of the folded counter multiplexer is selected in response to the SIGN bit and is depicted in FIG. 4. As depicted in FIG. 4, the values of $BIT_0$ through $BIT_{K-2}$ are inverted before the counter reaches one-half of full-scale (i.e., when the MSB is 0). The output of the folded counter multiplexer represents the absolute value of the frequency difference between the frequency of the VCO and the target frequency. FIG. 4 also depicts that the MSB of the counter shifts from 0 to 1 at the target frequency ($F_{target}$).

Referring back to FIG. 3, the folded bits that are output from the folded counter multiplexer 342 are compared to a deadband value. In particular, M bits of the folded counter value are compared to an M-bit deadband value at the comparator 344. When the folded counter value, A, is less than the deadband value, B, then the frequency difference between the VCO signal and the target frequency does not exceed the deadband limit and the digital phase detector should be used to control the VCO (i.e., ACTIVE=0). If the folded counter value, A, is greater than the deadband value, B, then the frequency difference between the VCO signal and the target frequency does exceed the deadband limit and the frequency detector should be used to control the VCO (i.e., ACTIVE=1). Because a folded counter is used in the comparison, a simple magnitude comparator can be used to generate the ACTIVE signal.

The number of deadband bits, M, available determines the maximum deadband frequency that can be programmed. Typically, the frequency difference between the VCO signal and the target frequency is a small percentage of the VCO frequency range and therefore, the number of deadband bits M needed is less than the number of counter bits, K. In the embodiment of FIG. 3, the higher bits (e.g., $BIT_{M+1}$ through $BIT_{K-2}$) are OR'd together and the output of the OR logic is OR'd again with the output from the comparator. This reduces the number of program bits needed and reduces the complexity of the comparator.

In an embodiment of the frequency detector, a single programmable deadband region is used and in another embodiment, two programmable deadband regions are used. The size or sizes of the deadband region or regions can be adjusted in response to changes in the frequency of the VCO signal. In one implementation, the process (referred to herein as "deadband hysteresis") involves establishing a first deadband region for use when the frequency detector is controlling the VCO (i.e., when ACTIVE=1) and a second deadband region for use when the digital phase detector is controlling the VCO (i.e., when ACTIVE=0). The deadband regions are defined by the frequency difference between the VCO signal and the target frequency (i.e., ΔF). The frequency difference that is used as the deadband limit when the frequency detector is controlling the VCO (i.e., when the frequency detector is active) is referred to as $F_A$ and the frequency difference that is used as the deadband limit when the digital phase detector is controlling the VCO (e.g., when the VCO signal is locked to the input signal or within the capture range of the digital phase detector) is referred to as $F_L$. For proper deadband hysteresis, the frequency difference when the frequency detector is active, $F_A$, should be less than the frequency difference when the digital phase detector is active, $F_L$. In the embodiment of FIG. 3, deadband hysteresis is implemented by providing one of two deadband values to the comparator, where $DB_A$ represents $F_A$ and $DB_L$ represents $F_L$. The two deadband values are selected by the deadband hysteresis multiplexer 350. The active deadband value, $DB_A$, is selected by the deadband hysteresis multiplexer when ACTIVE=1 and the locked deadband value, $DB_L$, is selected by the deadband hysteresis multiplexer when ACTIVE=0. The result of this logic is that the deadband region is defined by $\pm F_A$ while the frequency detector is controlling the VCO and by $\pm F_L$ once the digital phase detector begins to control the VCO. A benefit of deadband hysteresis is that the frequency detector can be set up to pull the frequency of the VCO signal arbitrarily close to the target frequency (e.g., deep within the capture range of the digital phase detector to ensure a reliable and robust lock) and then to widen the deadband region to prevent the frequency detector from prematurely asserting control over the VCO signal.

Figure 5A:
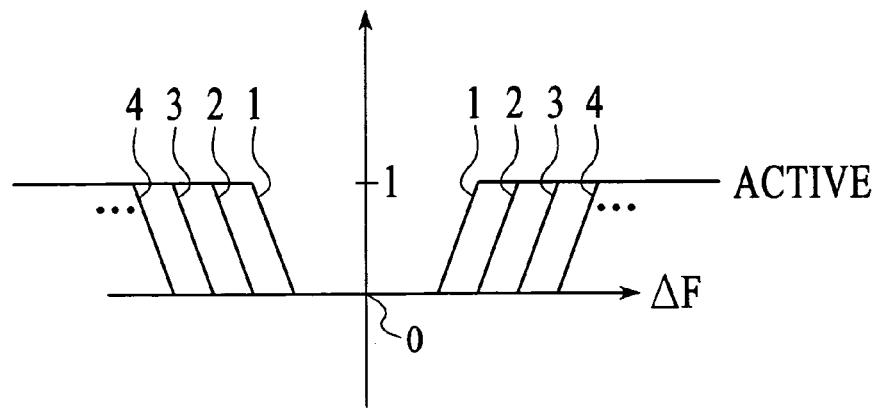
FIG. 5A depicts exemplary deadband regions that can be established by changing a deadband value.
Figure 5B:
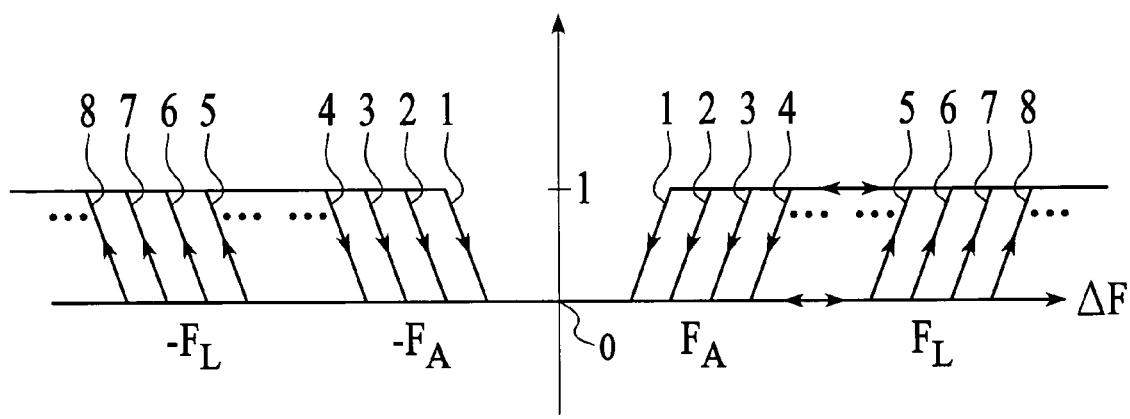
FIG. 5B depicts exemplary deadband regions that can be established by setting different values for DBA and DBL in the frequency detector of FIG. 3.

The deadband logic described above with reference to FIGS. 2 and 3 accommodates a fully programmable deadband region. The size of the deadband region is programmable by changing the deadband value. FIG. 5A depicts the transfer characteristics of a frequency detector with four programmable deadband regions (e.g., deadband regions 1, 2, 3, and 4). A particular deadband region is established by setting the deadband value accordingly. Both deadband regions of a deadband hysteresis implementation are equally programmable by setting the deadband values accordingly. FIG. 5B depicts the transfer characteristics of a frequency detector with dual programmable deadband regions. The programmable deadband regions that can be established when the frequency detector controls the VCO are identified as deadband regions 1, 2, 3, and 4 and the programmable deadband regions that can be established when the digital phase detector is controlling the VCO are identified as deadband regions 5, 6, 7, and 8. The dual programmable deadband regions are established by setting deadband values for $DB_A$ and $DB_L$. In both FIGS. 5A and 5B, the horizontal axis represents a measure of frequency and the vertical axis represents the status of the ACTIVE signal (e.g., either "0" or "1").

It should be understood that the above-described embodiment can be negatively impacted by "flipping" of the counter, that is, when the counter turns over to all zeros during the known time period. In the embodiment described above, the MSB of the counter may be zero even though the VCO frequency is greater than the target frequency if the number of transitions measured during the known time period is high enough to flip the counter. The negative impact of flipping can be prevented by ensuring that the counter has enough bits that the counter will not flip to zero when the highest possible VCO frequency is applied.

In addition to the above-described frequency detection techniques, the frequency information produced by the frequency detector can be used to reduce the frequency acquisition time (also referred to herein as the pull-in time) of the frequency detector. In accordance with the invention, different charging currents are provided to the charging capacitor 120 in response to the frequency information that is provided by the frequency detector 104 (as depicted in FIG. 1). For example, when the frequency detector is controlling the VCO signal, different charging currents are provided to the capacitor depending on how far the VCO signal frequency is from the target frequency. These charging currents are higher than the charging current that is supplied to the capacitor when the digital phase detector is controlling the VCO, therefore causing greater frequency shifts and faster pull-in during each frequency correction cycle. The charging current that is applied during each correction cycle is selected as a function of how much the frequency of the VCO signal differs from the target frequency. For example, the more the frequency of the VCO signal differs from the target frequency, the larger the charging current.

In one implementation, a frequency correction cycle has two phases, a measurement phase ($\Delta T_1$) and a correction phase ($\Delta T_2$). During the measurement phase, the average frequency of the VCO signal during the time $\Delta T_1$ is measured. During the correction phase, the VCO controlling voltage, $V_{tune}$, is changed by an amount equal to $\Delta V$, where $\Delta V = I_F * \Delta T_2 / C$. In this equation, $I_F$ is the current applied to node $V_{tune}$ in FIG. 1A, $\Delta T_2$ is the time interval of the correction phase, and C is the capacitance of the capacitor 120. The change in voltage produces a corresponding VCO frequency change, $\Delta F$, which is equal to $K_V * \Delta V$, where $K_V$ is the VCO tuning gain in Hz/V, for example. Correction cycles continue until the frequency of the VCO signal falls within the deadband region, at which point control of the VCO switches over to the digital phase detector. During each correction phase, the amount of charging current, $I_F$, required to produce a certain $\Delta V$ is inversely proportional to $\Delta T_2$. Practical circuit limitations such as transistor size generally limit the maximum value of the charging current, $I_F$, thereby setting a limit to the minimum value of $\Delta T_2$. In an embodiment, $\Delta T_2 = \Delta T_1 \approx 1.65$ μs.

A large charging current will cause a correspondingly large change in the VCO frequency, $\Delta F$, during a correction cycle. A large change in the VCO frequency can be problematic because the frequency detector is trying to pull the frequency of the VCO signal to a value that is within the deadband region, where the deadband region is typically less than 1% of the target frequency. If the deadband region is stepped over during a correction cycle, the frequency detector must then switch the SIGN signal and push the frequency of the VCO signal back in the other direction. Since the step sizes in both directions are of roughly equal amount, the frequency of the VCO signal could "ping-pong" around the target frequency, missing the deadband region for an indefinite amount of time. To prevent "ping-ponging," the maximum change in frequency of the VCO signal, $\Delta F$, during a single correction phase is made less than twice the minimum desired programmable value of the deadband frequency, $F_A$. This technique will prevent the ping-pong effect for the case of the minimum deadband region at the expense of very long pull-in times if the frequency of the VCO signal is far away from the target frequency.

Figure 6:
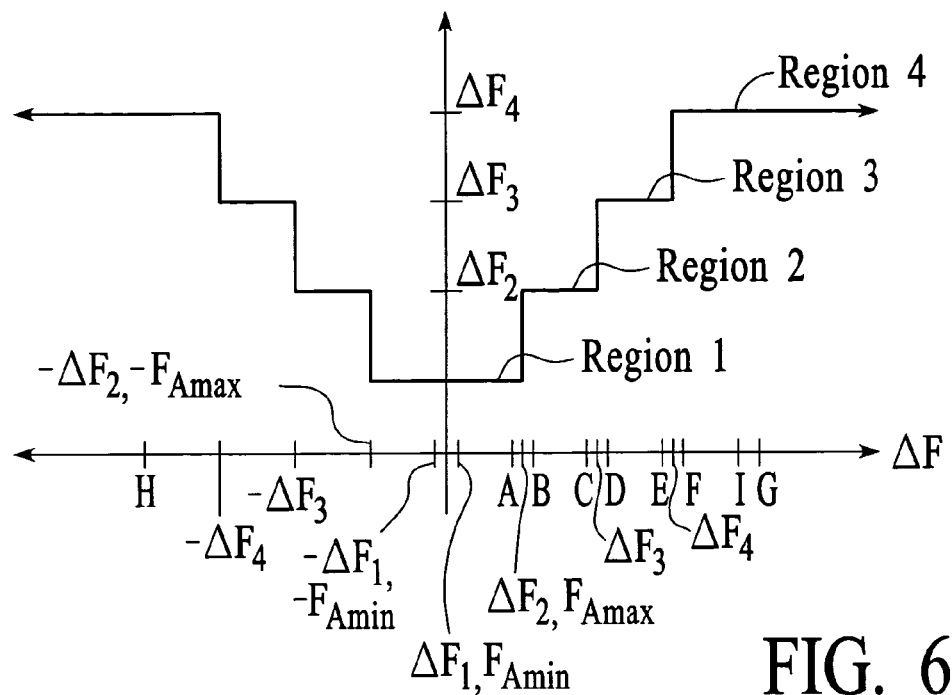
FIG. 6 depicts an example of four frequency regions on a graph of the difference in frequency between the VCO signal and the target frequency on the horizontal axis versus the change in frequency that is targeted during a corresponding correction phase on the vertical axis.

In accordance with the invention, multiple frequency regions are established and the change in frequency, $\Delta F$, that is targeted during a correction phase corresponds to the frequency region in which the measured VCO frequency falls. In general, the change in frequency, $\Delta F$, that is targeted for a particular correction phase is established such that the frequency of the VCO will be pulled into the deadband region in one correction cycle. In an embodiment, four frequency regions are established to reduce the pull-in time of the frequency detector. The four regions are depicted in FIG. 6, which is a graph of the difference in frequency between the VCO signal and the target frequency on the horizontal axis versus the change in frequency that is targeted during a corresponding correction phase on the vertical axis. Referring to FIG. 6, the first frequency region (region 1) covers all possible values of $F_A$, from $F_{Amin}$ to $F_{Amax}$. In this region, the targeted change in frequency is equal to twice the minimum deadband frequency, $\Delta F_1 = 2F_{Amin}$. That is, when the VCO frequency is in this region, each correction cycle will pull the VCO frequency by $2F_{Amin}$ towards the target frequency. Once the difference in frequency between the measured VCO frequency and the target frequency is less than the pre-established value, $F_A$, then control is switched to the digital phase detector (e.g., ACTIVE=0). This relationship prevents the ping-pong effect for the narrowest deadband region. The remaining frequency regions can have larger frequency steps without the risk of overshooting the deadband region because the target region, region 1, is equal to $F_{Amax}$, which is substantially wider than $F_{Amin}$. The frequency step for region 2, $\Delta F_2$, and the width of region 2 are set equal to the width of region 1, $F_{Amax}$. This configuration guarantees that a maximum of one correction cycle is needed to get from anywhere within region 2 into region 1 without crossing over region 1. The frequency step for region 3, $\Delta F_3$, is twice that for region 2. This guarantees that a maximum of one correction cycle is needed to get from anywhere within region 3 into region 1. Likewise, the frequency step for region 4, $\Delta F_4$, is three times that of region 2. In the implementation of FIG. 6, region 4 is the last region and when the VCO falls into region 4, it may take more that one correction cycle to get the VCO signal to the deadband region. Additional regions can be added in a similar manner, until the practical maximum value of $I_2$ is reached. Scaling the frequency steps and widths of the regions in this way allows large pull-in currents to be used when the VCO frequency is far away from the target frequency while preventing "ping ponging."

Figure 7:
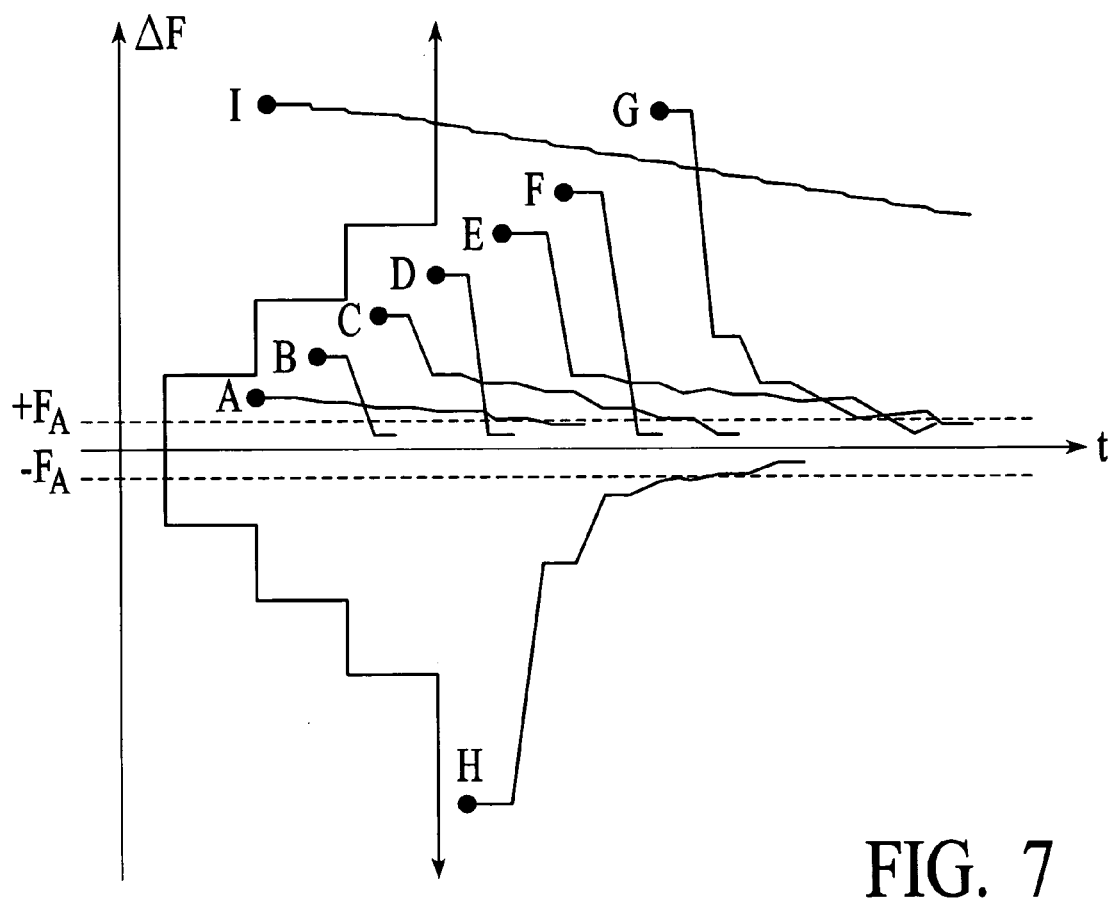
FIG. 7 depicts an example of transient frequency responses as a function of various starting frequencies given the frequency regions as depicted in FIG. 6.

In operation, during the measurement phase of a correction cycle, the counter value is examined after a sample period to determine within which frequency region the VCO signal falls. The appropriate amount of charging current is selected as a function of the frequency region in which the VCO falls. During the correction phase, the frequency of the VCO signal is pushed towards the deadband region by an amount $\Delta F$ (e.g., $\Delta F_1$, $\Delta F_2$, $\Delta F_3$, or $\Delta F_4$ as appropriate). The process repeats until the measured frequency of the VCO signal falls within the programmed deadband region. The frequency detector then relinquishes control of the VCO to the digital phase detector and lock is eventually acquired by the PLL. FIG. 7 is a graph of the difference in frequency between the VCO signal and the target frequency on the vertical axis versus time on the horizontal axis. FIG. 7 graphically depicts exemplary transient frequency responses as a function of various starting frequencies (A, B, C, D, E, F, G, H, and I) given the frequency regions depicted in FIG. 6. As depicted in FIG. 7, the frequencies rapidly converge into region 1 and are pulled gradually towards the target frequency once within region 1. The corresponding starting frequencies (A, B, C, D, E, F, G, H, and I) of the exemplary transient frequency responses are also identified on the horizontal axis of FIG. 6. An exemplary transient frequency response that would occur without accelerated convergence is depicted in FIG. 7 with starting frequency I.

Figure 8:
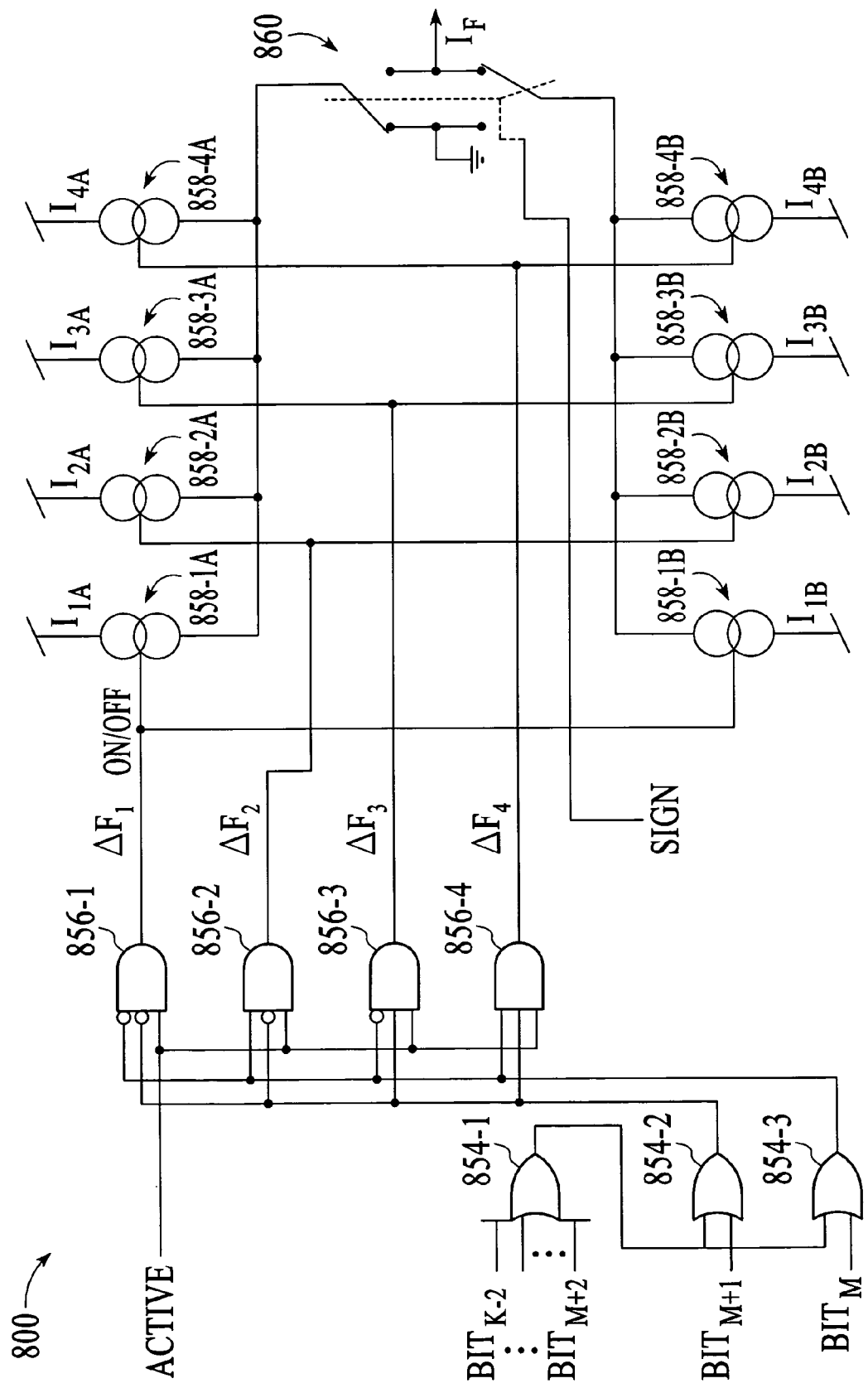
FIG. 8 depicts an example of current logic that is configured to provide different charging currents to a loop filter in response to frequency information.

FIG. 8 depicts an example of current logic that is configured to provide different charging currents to a loop filter of a PLL in response to frequency information from the frequency detector as described with reference to FIGS. 2-5. In an embodiment, the current logic is connected to the loop filter 110 of FIG. 1 to provide the respective charging current to the charging capacitor 120. In the example of FIG. 8, the current logic 800 is configured to provide four different charging currents to the loop filter depending on the frequency region in which the VCO signal falls. For example, there are four different charging currents, which correspond to the four different frequency regions depicted in FIG. 6. The current logic includes OR logic 854-1, 854-2, and 854-3, selection logic 856-1, 856-2, 856-3, and 856-4, current sources 858-1A, 858-1B, 858-2A, 858-2B, 858-3A, 858-3B, 858-4A, 858-4B, and control logic 860. The OR logic is connected to receive counter bits from $BIT_M$ through $BIT_{K-2}$. OR logic 854-1 is connected to receive the counter values $BIT_{M+2}$ through $BIT_{K-2}$. OR logic 854-2 is connected to receive the output of OR logic 854-1 and $BIT_{M+1}$. The output of OR logic 854-2 is connected to the selection logic 856-1 through 856-4. OR logic 854-3 is connected to receive the output of OR logic 854-1 and $BIT_M$. The output of OR logic 854-3 is connected to the selection logic 856-1 through 856-4. The outputs from OR logic 854-2 and 854-3 and the ACTIVE signal are connected to AND gates of the selection logic 856-1, 856-2, 856-3, and 856-4. Each AND gate of the selection logic is connected to corresponding current sources 858-1A through 858-4B. The current sources are connected to the control logic 860. Control logic 860 receives the SIGN signal as an input to control whether a positive or negative current is drawn from the current sources. In operation, the value of the bits from the counter, as depicted in FIG. 3, are used by the OR logic and the selection logic to determine within which frequency region the VCO signal falls (e.g., region 1 as defined by $\Delta F_1$, region 2 as defined by $\Delta F_2$, region 3 as defined by $\Delta F_3$, and region 4 as defined by $\Delta F_4$. The corresponding current source (e.g., $I_{1A}$, $I_{1B}$, $I_{2A}$, $I_{2B}$, $I_{3A}$, $I_{3B}$, $I_{4A}$, or $I_{4B}$) is activated depending on the frequency region. The SIGN signal controls the direction of the current flow and the ACTIVE signal controls whether or not the current logic is able to produce any charging current. In an embodiment, the four different charging currents are defined by $I_1 = 2CF_{Amin}/K_V \Delta T_2$, $I_2 = 2CF_{Amax}/K_V \Delta T_2$, $I_3 = 2I_2$, $I_4 = 2I_3$.

FIG. 9 depicts a process flow diagram of a frequency detection method in accordance with the invention. At block 902, a preset value is established. At block 904, a counter value is preset to the preset value. At block 906, the counter value is changed from the preset value in response to a voltage controlled oscillator (VCO) signal over a known time period. At block 908, frequency information related to the VCO signal is obtained from the counter value at the end of the known time period.

Referring back to FIG. 3, the VCO signal that drives the counter 322 is not synchronized with the signal that is provided by the reference clock. Because the VCO signal and reference clock signal are not synchronized, it is possible that the rising edges of the VCO signal and the enable signal could coincide with each other and cause the counter to be driven into a temporary metastable state. The metastable state of the counter may cause the counter to have an inaccurate value at the end of the respective sampling period. If the metastable state causes the counter value to be higher than it should have been at the end of the sampling period, then the inaccurate counter value could cause the frequency detector to assert control over the VCO signal even though the frequency of the VCO is within the established deadband region. Although metastable-induced errors would be rare, they may be unacceptable in some applications.

Figure 10:
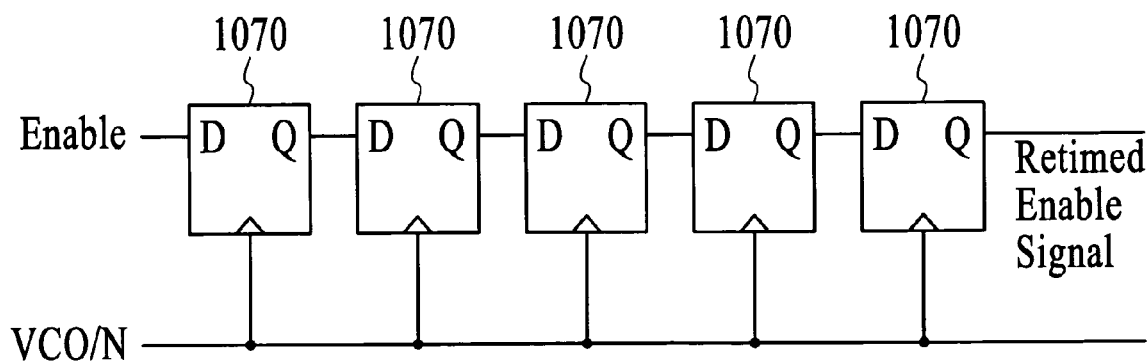
FIG. 10 depicts a chain of flip-flops that are connected in series and driven by the VCO signal.

The problem of metastable-induced errors can be controlled by ensuring that the rising edges of the VCO and enable signals do not coincide. In an embodiment of the frequency detector, a series of flip-flops driven by the VCO is used to ensure that the rising edges of the VCO and enable signals do not coincide. FIG. 10 depicts flip-flops 1070 that are connected in series and whose clock inputs are driven by the VCO signal. The enable signal is input into the first flip-flop in the chain and a retimed enable signal is output from the last flip-flop in the chain. In operation, the first flip-flop may go into a metastable state if the rising edges of the VCO and enable signals coincide. The metastable state will be propagated down the chain of flip-flops, with each flip-flop imparting a delay, T, and having a latch time constant, τ. The ratio of the delay imparted by each flip-flop over the latch time constant (T/τ), determines the probability that a metastable state resolves itself. By the time the enable signal has propagated through the chain of flip-flops, the probability that the metastable state has not resolved is negligibly small and the retimed enable signal can be used to enable the counter without driving the counter into a metastable state.

Although the counter is described as being incremented in response to the VCO signal, the counter could alternatively be decremented with the related logic being adjusted accordingly.

Although specific embodiments in accordance with the invention have been described and illustrated, the invention is not limited to the specific forms and arrangements of parts so described and illustrated. The invention is limited only by the claims.

What is claim is:

1. A phase-locked loop comprising:
a voltage controlled oscillator (VCO); and
a frequency detector in signal communication with said VCO, said frequency detector including:
a counter configured to receive:
a VCO signal from said VCO; and
a preset value; and
a controller operable to control said counter;
wherein said counter generates frequency information related to said VCO signal in response to said controller, said VCO signal, and said preset value;
wherein:
said controller is additionally configured to generate a preset signal and an enable signal to control said counter;
said controller generates said enable signal for a known time period in response to a reference clock;
said preset signal sets said counter to sad preset value; and
said frequency information is generated by said VCO signal changing said counter over said known time period in response to said enable signal.

2. The phase-locked loop of claim 1 wherein said preset value is selected such that the counter is at one-half full-scale at the end of said known time period when the VCO signal is oscillating at a target frequency.

3. The phase-locked loop of claim 1 further comprising deadband logic in signal communication with said counter, said deadband logic configured to determine whether the frequency of said VCO signal is controlled in response to a signal from said frequency detector or a signal from a phase detector.

4. The phase-locked loop of claim 3 wherein said deadband logic is configured to use dual deadband values to determine whether the frequency of said VCO signal is controlled in response to said signal from said frequency detector or said signal from said phase detector.

5. The phase-locked loop of claim 1 further including logic connected to said counter for providing different charging currents to said loop filter dependent on said frequency information from said counter.

6. A phase-locked loop comprising:
a voltage controlled oscillator (VCO); and
a frequency detector in signal communication with said VCO, said frequency detector including:
a counter configured to receive:
a VCO signal from said VCO; and
a preset value; and
a controller operable to control said counter;
wherein said counter generates frequency information related to said VCO signal in response to said controller, said VCO signal, and said preset value;

wherein said preset value is selected such that the counter is at one-half full-scale at the end of said known time period when the VCO signal is oscillating at a target frequency.

7. The phase-locked loop of claim 6 wherein:

said controller is additionally configured to generate a preset signal and an enable signal to control said counter;

said controller generates said enable signal for a known time period in response to a reference clock;

said preset signal sets said counter to said preset value; and said frequency information is generated by said VCO signal changing said counter over said known time period in response to said enable signal.

8. The phase-locked loop of claim 6 further comprising deadband logic in signal communication with said counter, said deadband logic configured to determine whether the frequency of said VCO signal is controlled in response to a signal from said frequency detector or a signal from a phase detector.

9. The phase-locked loop of claim 8 wherein said deadband logic is configured to use dual deadband values to determine whether the frequency of said VCO signal is controlled in response to said signal from said frequency detector or said signal from said phase detector.

10. The phase-locked loop of claim 6 further including logic connected to said counter for providing different charging currents to said loop filter dependent on said frequency information from said counter.

11. A phase-locked loop comprising:

a voltage controlled oscillator (VCO); and a frequency detector in signal communication with said VCO, said frequency detector including:

a counter configured to receive:

a VCO signal from said VCO; and a preset value; and a controller operable to control said counter;

wherein said counter generates frequency information related to said VCO signal in response to said controller, said VCO signal, and said preset value;

deadband logic in signal communication with said counter, said deadband logic configured to determine whether the frequency of said VCO signal is controlled in response to a signal from said frequency detector or a signal from a phase detector.

12. The phase-locked loop of claim 11 wherein:

said controller is additionally configured to generate a preset signal and an enable signal to control said counter;

said controller generates said enable signal for a known time period in response to a reference clock;

said preset signal sets said counter to said preset value; and said frequency information is generated by said VCO signal changing said counter over said known time period in response to said enable signal.

13. The phase-locked loop of claim 11 wherein said preset value is selected such that the counter is at one-half full-scale at the end of said known time period when the VCO signal is oscillating at a target frequency.

14. The phase-locked loop of claim 11 wherein said deadband logic is configured to use dual deadband values to determine whether the frequency of said VCO signal is controlled in response to said signal from said frequency detector or said signal from said phase detector.

15. The phase-locked loop of claim 11 further including logic connected to said counter for providing different charging currents to said loop filter dependent on said frequency information from said counter.

* * * * *